United States Patent
Dagher et al.

(10) Patent No.: US 11,674,344 B2
(45) Date of Patent: Jun. 13, 2023

(54) OUT-OF-PLANE HINGE FOR MICRO AND NANOELECTROMECHANICAL SYSTEMS WITH REDUCED NON-LINEARITY

(71) Applicant: COMMISSARIAT A L'ENERGIE ATOMIQUE ET AUX ENERGIES ALTERNATIVES, Paris (FR)

(72) Inventors: Samer Dagher, Grenoble (FR); Loic Joet, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 726 days.

(21) Appl. No.: 16/716,632

(22) Filed: Dec. 17, 2019

(65) Prior Publication Data
US 2020/0199923 A1 Jun. 25, 2020

(30) Foreign Application Priority Data
Dec. 20, 2018 (FR) ...................... 18 73564

(51) Int. Cl.
*E05D 3/06* (2006.01)
*B81B 7/00* (2006.01)
(Continued)

(52) U.S. Cl.
CPC .............. *E05D 3/06* (2013.01); *B81B 7/0003* (2013.01); *G01C 19/56* (2013.01); *G01P 15/08* (2013.01);
(Continued)

(58) Field of Classification Search
CPC ......... G01P 15/08; G01P 15/02; G01C 19/56; B81B 3/0059; B81B 3/0037; B81B 3/051;
(Continued)

(56) References Cited

U.S. PATENT DOCUMENTS

| 8,371,166 B2 | 2/2013 | Robert | |
| 2013/0107339 A1* | 5/2013 | Horie | G02B 26/0858 359/213.1 |

(Continued)

FOREIGN PATENT DOCUMENTS

FR        2 941 533 A1    7/2010

OTHER PUBLICATIONS

French Preliminary Search Report dated Sep. 26, 2019 in French Application 18 73564 filed on Dec. 20, 2018 (with English Translation of Categories in Cited Documents), 3 pages.

*Primary Examiner* — Helen C Kwok
(74) *Attorney, Agent, or Firm* — Oblon, McClelland, Maier & Neustadt, L.L.P.

(57) ABSTRACT

A hinge for a microelectromechanical system includes a fixed part and a part movable relative to the fixed part along at least an out-of-plane direction, the hinge being intended to suspend the moving part from the fixed part. The hinge includes a first rigid part, a second part fixed to the first part at one end and intended to be anchored to the fixed part or the moving part. The second part deforms in bending in a first direction, two third parts are fixed to the first part and are anchored to the moving part or the fixed part, and the third parts deform in bending along a second direction orthogonal to the first direction.

18 Claims, 6 Drawing Sheets

(51) Int. Cl.
  *G01C 19/56* (2012.01)
  *G01P 15/08* (2006.01)
  *B81B 3/00* (2006.01)

(52) U.S. Cl.
  CPC ..... *B81B 3/0037* (2013.01); *B81B 2201/0235* (2013.01); *B81B 2203/0154* (2013.01); *B81B 2203/053* (2013.01)

(58) Field of Classification Search
  CPC ..... B81B 3/0072; B81B 7/0003; F16C 11/04; F16C 11/12; E05D 3/06
  See application file for complete search history.

(56) References Cited

U.S. PATENT DOCUMENTS

| | | | | |
|---|---|---|---|---|
| 2014/0331770 | A1* | 11/2014 | Jourdan | G01P 15/02 73/514.01 |
| 2014/0338450 | A1* | 11/2014 | Classen | G01P 15/125 73/514.32 |
| 2015/0033860 | A1* | 2/2015 | Kim | G01P 15/08 73/514.35 |
| 2015/0355221 | A1* | 12/2015 | Robert | G01P 15/0802 216/13 |

* cited by examiner

OUT-OF-PLANE HINGE FOR MICRO AND NANOELECTROMECHANICAL SYSTEMS WITH REDUCED NON-LINEARITY

TECHNICAL DOMAIN AND STATE OF PRIOR ART

This invention relates to an out-of-plane hinge for microelectromechanical and/or nanoelectromechanical systems providing reduced non-linearity and a system making use of at least two such hinges.

Microelectromechanical systems or MEMS and micro & nanoelectromechanical systems or M&NEMS are used to make sensors or actuators. They comprise at least one element able to move relative to a substrate. For example, in the case of a sensor, displacement of the moving part or the mass is measured and can be translated into a characteristic to be detected, for example an acceleration, and in the case of an actuator, the moving element is moved for example by means of electrostatic forces, for example to displace a micromirror.

The moving element is suspended from the substrate and depending on the application, it may be required to have a displacement in the plane of the system or an out-of-plane displacement, i.e. orthogonal to the plane of the system.

When the moving element has a large amplitude displacement in the out-of-plane direction, the connection zone may have large non-linearity.

Figure 1A:
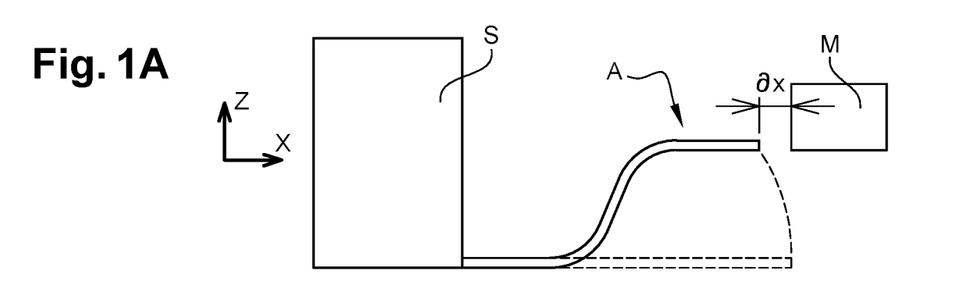
FIGS. 1A and 1B are side views of a MEMS system according to prior art in the rest state and in a state in which the mass is displaced in the out-of-plane direction and illustrating elongation of the hinge.
Figure 1B:
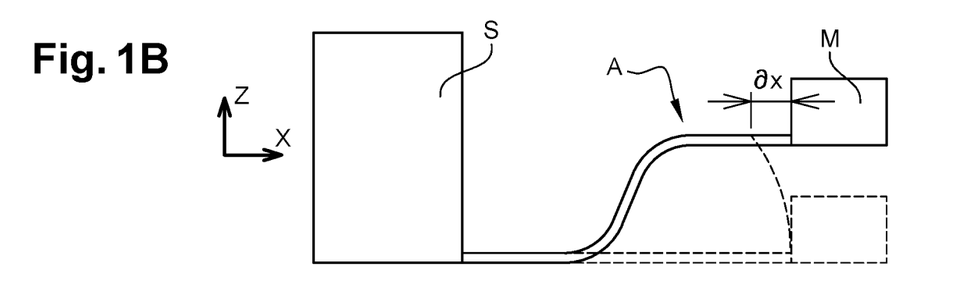
Figure 1C:
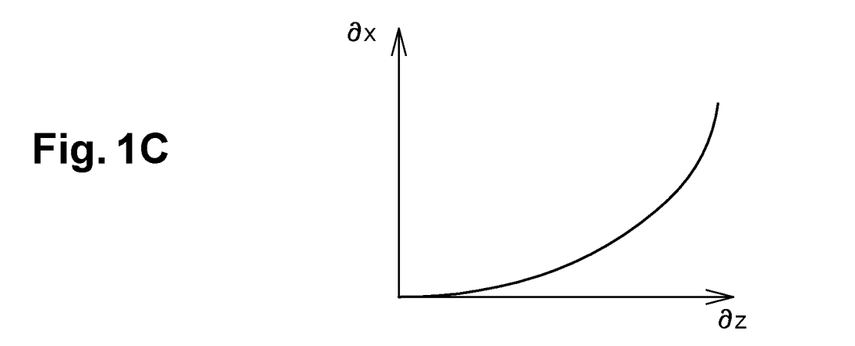
FIG. 1C is a graphic representation of the elongation of the hinge in FIGS. 1A and 1B, in the X direction as a function of the displacement of the mass in the Z direction.

This non-linear behaviour is illustrated on FIGS. 1A to 1C. The moving mass M is suspended from the substrate S by a hinge A formed from a thin membrane. Displacement of the mass M in the Z direction causes a first order deformation of the membrane in the Z direction and a second order deformation in the X direction. When the displacement of the mass in the Z direction is large, elongation of the membrane in the X direction (FIG. 1B) is no longer negligible. The result is that the return force applied by the membrane on the mass is non-linear (FIG. 1C) and varies widely with displacement in the Z direction. This non-linearity can significantly affect the response of the system, for example in the case of a sensor, and can make it unreliable.

PRESENTATION OF THE INVENTION

Consequently, one purpose of this invention is to provide a hinge for a MEMS or M&NEMS system having low non-linearity and a MEMS or M&NEMS system for which the moving part can have a large out-of-plane translational displacement while having low non-linearity.

The purpose stated above is achieved by a hinge that is intended to connect a first element and a second element of a MEMS or M&NEMS system, comprising a first part rigid in the three directions of space, a second part connected to the first part and that is intended to be connected to the first element, the second part that is intended to extend in the plane of the system and that is deformable in bending in the out-of-plane direction, and two third parts configured to deform in in-plane bending, each of the two third parts being connected to one end of the first part such that, when a relative displacement between the first and the second elements takes place in the first direction the second part is deformed in bending in the out-of-plane direction and the two third parts are deformed in bending in a direction in the plane. The three parts then enable in-plane elongation so as to limit in-plane deformation of the second part, and therefore reduce non-linearity of the hinge.

With the invention, in-plane deformation of the second part is reduced or even eliminated by slight bending of the third parts that accompany the second part, via the first part, in its in-plane displacement.

In other words, a composite hinge is made comprising several parts, each of which performs a function so as to reduce non-linearity of the hinge. The hinge combines a hinge obtained by an element stressed in bending in the out-of-plane direction and a hinge obtained by elements configured to deform in bending in an in-plane direction, which gives the possibility of a large amplitude displacement in the out-of-plane direction while keeping a small degree of non-linearity.

Very advantageously, each part can be designed to adapt the properties of the hinge as a function of needs, for example the flexibility in the out-of-plane direction can be varied and/or guidance in a given direction can be improved.

Advantageously, a MEMS or M&NEMS system comprises at least two hinges which gives very good guidance in the out-of-plane direction and at least one guidance in the in-plane direction.

Very advantageously, the MEMS or M&NEMS comprises at least three hinges, and even more advantageously four hinges, so as to provide guidance in the out-of-plane direction and very good retention in the two in-plane directions.

A subject-matter of this invention is then a hinge between at least one first element and at least one second element of a microelectromechanical system, said first element and said second element being able to move relative to each other at least in an out-of-plane direction, said hinge comprising a first rigid part, a second part fixed to the first part at one end and intended to be anchored to the first element, said second part being configured to be deformable in bending in a first direction, and two third parts fixed to the first part and intended to be anchored to the second element, the third parts being configured to deform in bending along a second direction orthogonal to the first direction.

In one example embodiment, each third part comprises a blade, the two blades being coplanar and arranged so as to also deform in torsion. The hinge is then more flexible in the out-of-plane direction.

In another example embodiment, each third part comprises two blades, one blade of each third part being coplanar with a blade of the other third part and the two blades of a third part being arranged relative to each other so as to not deform in torsion, or to deform only slightly in torsion. The blades can result in linearity of the hinge while slightly modifying or not modifying the out-of-plane stiffness of the hinge.

The two parts can advantageously comprise a lattice structure to provide flexibility in the first direction and some stiffness in at least one third direction orthogonal to the first and second directions.

Another subject-matter of this invention is a microelectromechanical system comprising a first element and at least one second element able to move relative to each other at least in an out-of-plane direction, and at least two hinges according to the invention, each anchored to the first element and to the second element, and the hinges are oriented such that the first direction is the out-of-plane direction and the second and third directions are in-plane directions.

BRIEF DESCRIPTION OF THE DRAWINGS

This invention will be better understood after reading the following description and the appended drawings on which.

DETAILED PRESENTATION OF PARTICULAR EMBODIMENTS

In this application, the term "microelectromechanical system" or "MEMS system" is used to denote a micro and/or nanoelectromechanical system, i.e. a system comprising elements with micrometric dimensions and/or nanometric dimensions.

Figure 2:
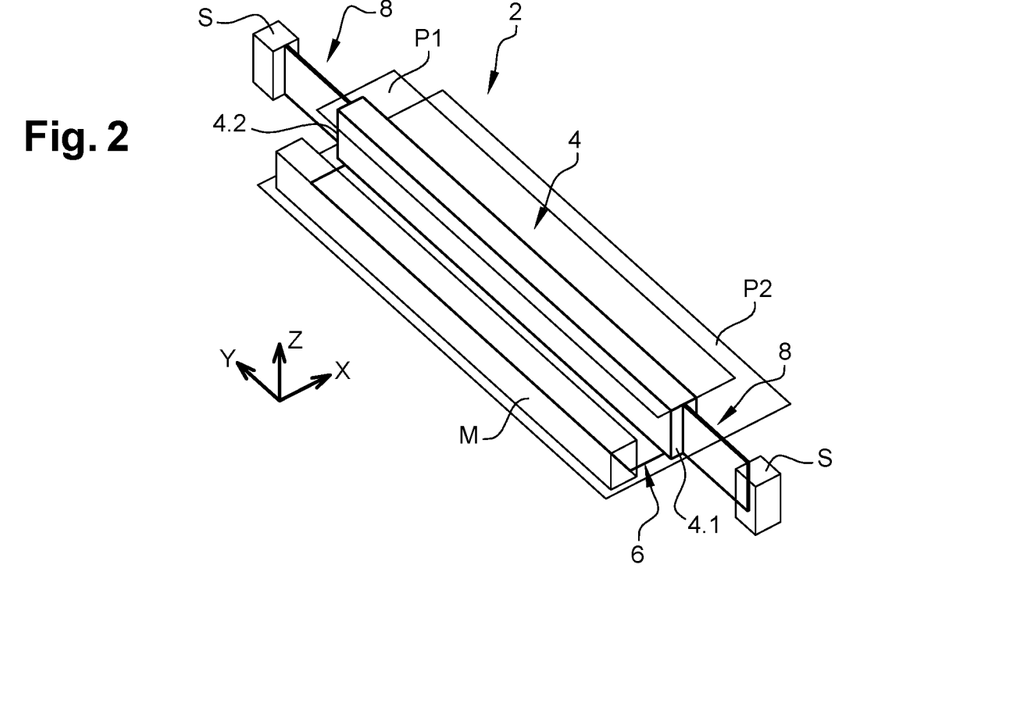
FIG. 2 is a perspective view of an example of a hinge according to the invention.
Figure 3:
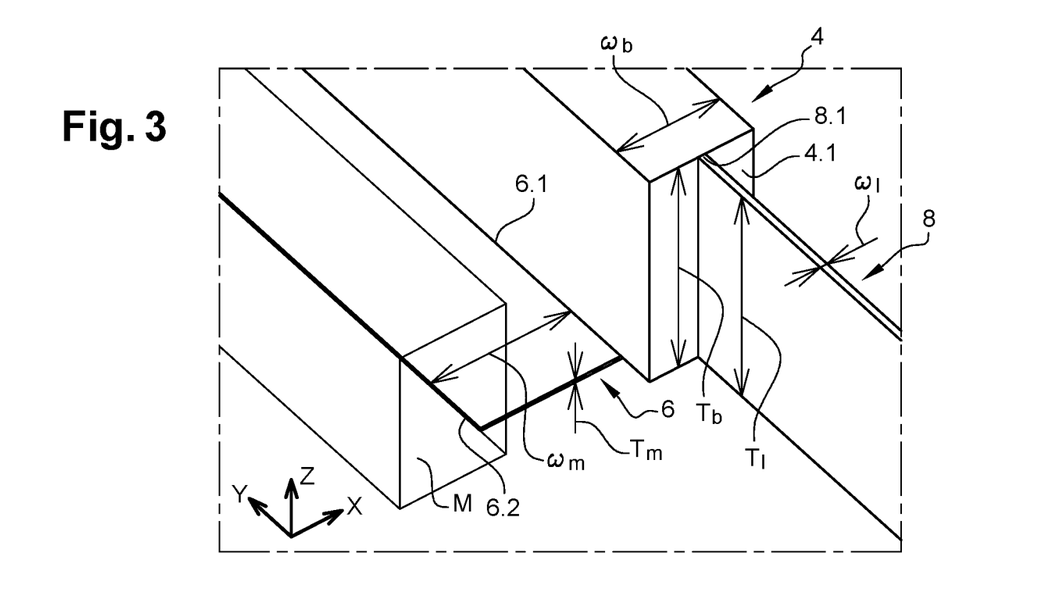
FIG. 3 is a detail view of FIG. 2.
Figure 4:
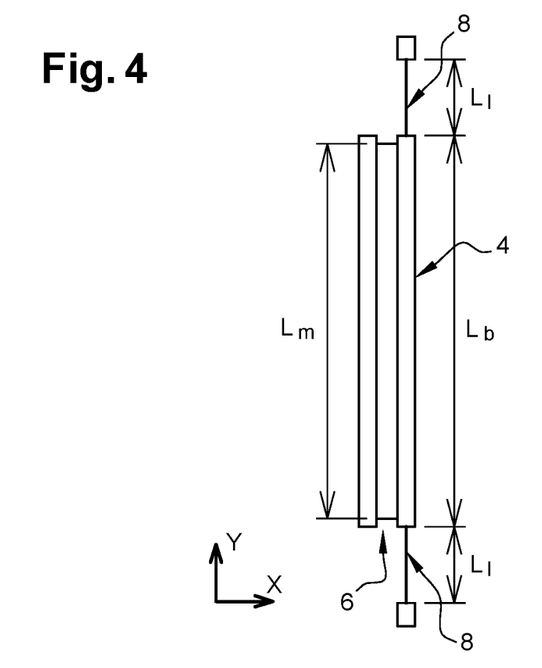
FIG. 4 is a top view of the hinge in FIG. 2.

FIGS. 2, 3 and 4 show an example of a hinge according to the invention. A fixed part or substrate S of a microelectromechanical system and a moving part or mass M that is intended to be suspended from the substrate S by the hinge 2 are shown in broken lines. It will be understood that the hinge can articulate two parts able to move relative to each other, and able to move relative to a fixed substrate.

The hinge 2 is designed to enable out-of-plane displacement of the moving part M.

The plane of the system is defined by the X and Y directions and corresponds to the median plane of the system in which the moving mass M extends, which is also the median plane of the fixed part.

The out-of-plane direction Z is orthogonal to the plane of the system.

The hinge comprises a first rigid part 4.

"Rigid part or element" means an element that does not deform or that deforms only slightly under the effect of stresses generally applied to a MEMS system in the case of a sensor or actuator during normal operation.

In the example shown, the first part 4 is in the shape of a parallelepiped-shaped beam with a thickness Tb, a width Wb and a length Lb. The first part extends in the Z direction between a first plane P1 and a second parallel plane P2.

The thickness Tb corresponds to the dimension of the beam along the Z direction, the width Wb corresponds to the dimension of the beam along the X direction and the length Lb corresponds to the dimension of the beam along the Y direction.

For example, the dimensions Tb, Wb and Lb are between several µm and several hundred µm.

The hinge 2 comprises a second part 6 representing a thickness Tm that is small compared with its length Lm and its width Wm so as to enable deformation in bending along the Z direction. For example, the Tm/Wm and Tm/Lm ratios are equal to between 1/100 and 1/10.

For example, its thickness Tm is between about a hundred nm and several hundred nm, its length Lm and its width Wm are between several µm and several hundred µm.

The second part 6 is then in the form of a membrane that is fixed to the first part 4 by a first edge 6.1 extending along the Y direction, and by a second edge 6.2 parallel to the first edge 6.1 and that is intended to be fixed to the mass M.

In the example shown, the membrane is placed on the plane P2 delimiting the lower face of the first part in the example shown. Furthermore, in the example shown, the lower face of the mass M is also contained in plane P2.

As a variant, the membrane could be anchored to the moving part in any position between planes P1 and P2.

The hinge 2 comprises two third parts 8 forming blades and fixed by one edge 8.1 to one end of the beam 4.1, 4.2 along the Y direction. The blades also extend in the YZ plane.

The blades are sized so that they can deform in bending in the Y direction. For example, the thickness Tl of the blades is between 10 µm and several tens of µm, the width Wl is between 100 nm and several micrometres and the length Ll is between several µm and several tens of µm.

In the example, the blades 8 extend in a median plane R of the beam parallel to the YZ plane.

The blades 8 are intended to be anchored on the fixed part S by an edge 8.2 parallel to the edge 8.1.

Figure 5:
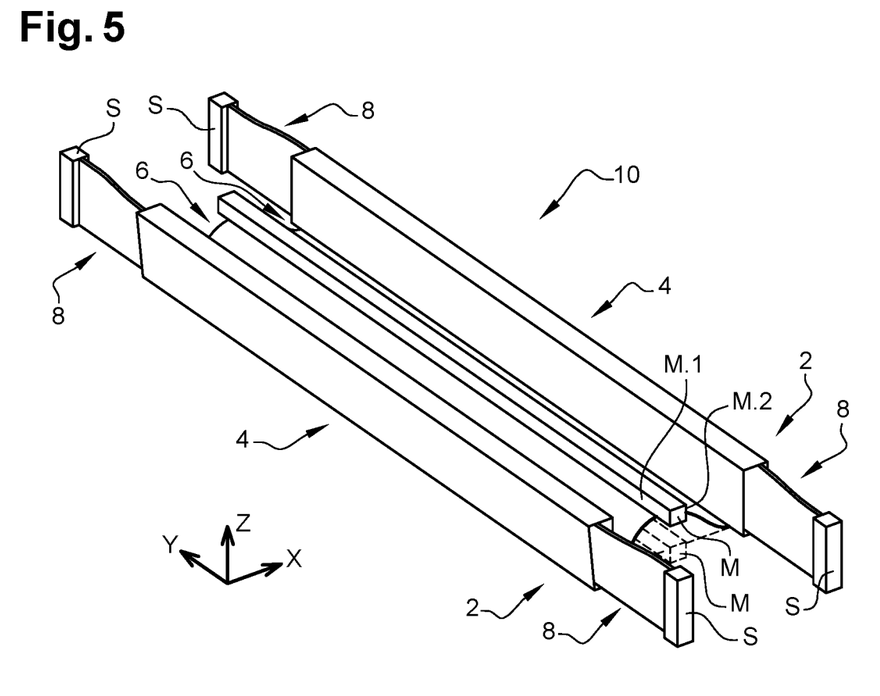
FIG. 5 is a perspective view of an example of an M&NEMS system comprising hinges according to the invention.

FIG. 5 illustrates a MEMS system 10 with two hinges 2. The hinges 2 are anchored on the moving part M symmetrically about a plane of symmetry of the moving part M parallel to the YZ plane.

The membranes 6 are anchored on parallel faces M.1, M.2 of the moving part M.

The blades are anchored on the fixed part S.

In the view shown in FIG. 5, the moving part M moves upwards out-of-plane, the membranes are deformed in bending and the blades 8 are deformed in bending in the X direction. The two blades 8 are also deformed in torsion about the Y axis, which reduces the stiffness of the hinge.

Operation of the hinge will now be described with reference to FIG. 5.

Considering the application to a sensor, for example an accelerometer designed to measure acceleration in the Z direction.

When the moving part is displaced out-of-plane under the effect of an acceleration along Z, the two membranes 6 are deformed in bending accompanying displacement of the moving part along Z, the blades 8 are deformed in bending along the X direction and also in torsion about the Y axis.

Deformations of the blades 8 in bending along X enable the beams 4 to displace along the X direction, and at the edges of the beams 4, to which the edges 6.1 of the membranes are fixed, and to accompany the membranes 6 in their deformation along the X direction. The result is a reduction in the variation of the stiffness of the structure, and therefore a reduction in the degree of non-linearity. The membranes are deformed mainly in the Z direction, and are no longer stretched along X. According to the invention, the hinges keep a small degree of non-linearity even for large amplitude displacements along Z.

The moving part is guided along the Z direction.

The hinges 2 have high stiffness along the Y direction, therefore the moving part is very well hold in the Y direction. Furthermore, the hinges 2 also retain the moving part in the X direction.

Figure 8:
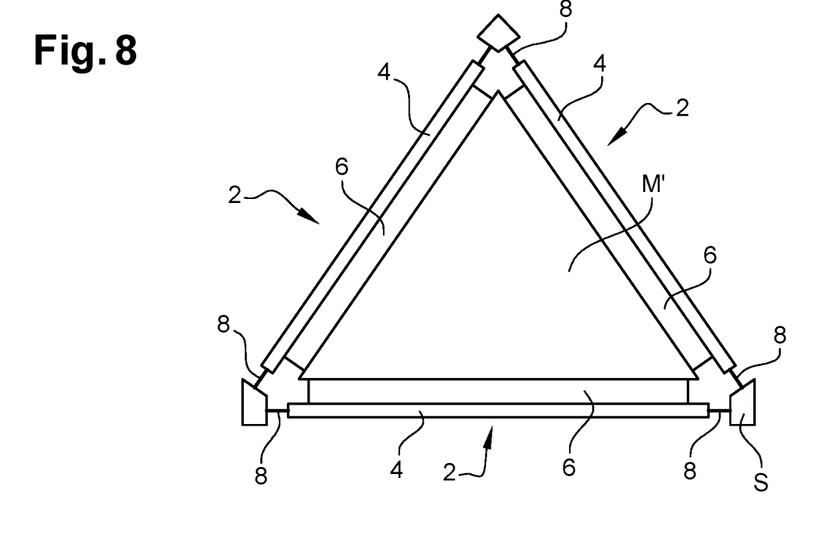
FIG. 8 is a top view of another example of a system comprising three hinges according to the invention.

In order to improve retention in the X direction, it is advantageous to add at least one third hinge 2, the three hinges 2 being distributed at 120° from each other about the moving mass M' as shown diagrammatically on FIG. 8.

Figure 9:
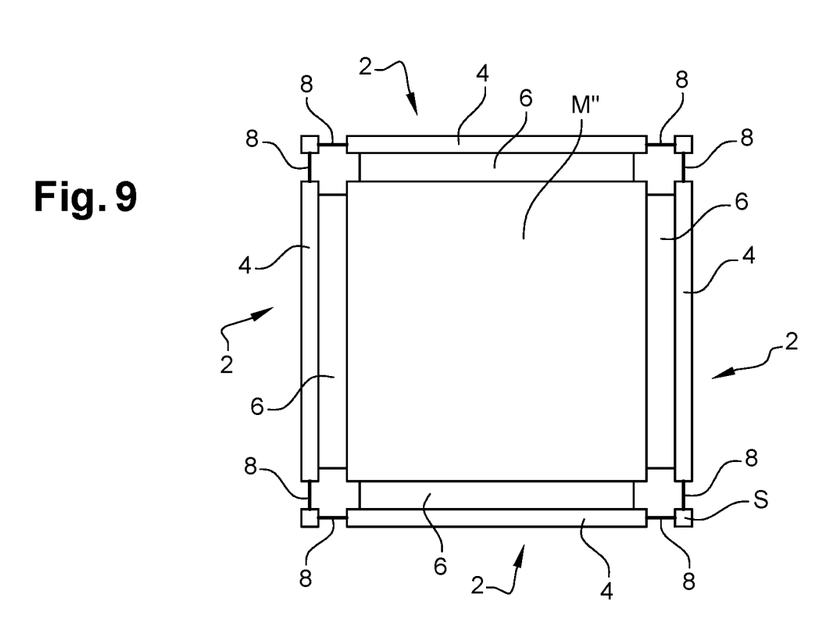
FIG. 9 is a top view of another example of a system comprising four hinges according to the invention.

On FIG. 9, the system comprises four hinges 2 arranged at 90° from each other. Each hinge 2 is anchored on one edge of the moving mass M".

The configurations of the systems in FIGS. 8 and 9 provide very good retention of the moving parts M in the XY plane and their guidance in the Z direction.

Figure 10:
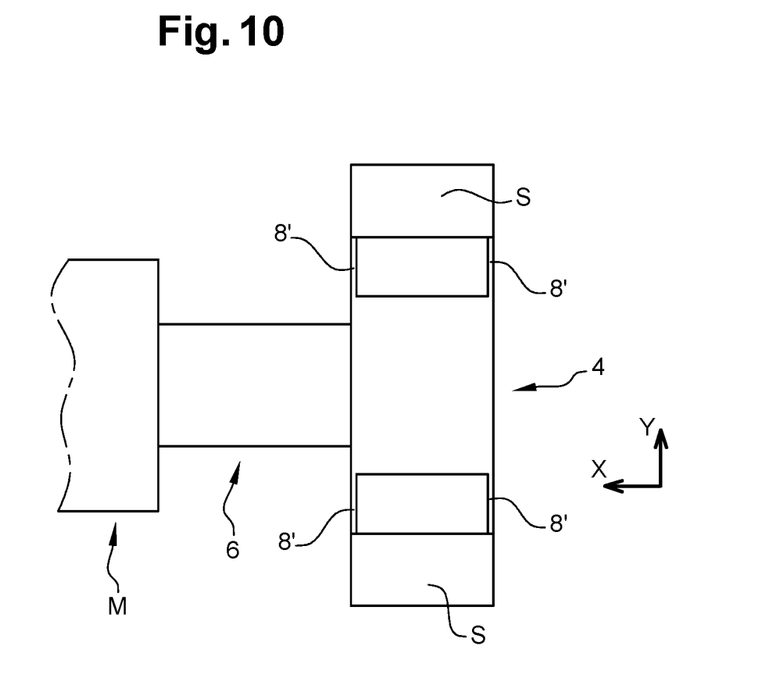
FIG. 10 is a top view of another example embodiment of a hinge in which the three parts are deformed almost entirely in bending.

FIG. 10 shows another example embodiment of a hinge, in which the hinges 8' are deformed almost entirely in bending along the X direction.

In this example, the hinge comprises a pair of blades 8' at each end of the beam 4.

The blades 8' of each pair are positioned parallel to each other in the YZ plane. In this example, one of their faces is aligned with a face of the beam parallel to the YZ plane. The use of two parallel blades 8' at each end blocks torsional deformation of each of the blades. The two blades 8' of each pair tend to deform individually in torsion, but in combination each blade 8' prevents torsional deformation of the other blade 8' during out-of-plane displacement of the moving part M. The blades then deform mainly in bending and accompany in-plane displacement of the membrane 6. The non-linear stiffness of the hinge is significantly reduced.

Preferably, the membranes are structured to have shapes providing high flexibility along Z and high in-plane stiffness, for example they comprise spiders or lattices and/or are perforated.

Therefore it is found that the stiffness of the hinge in the different directions is determined both by the dimensions of the membrane and the dimensions of the blades, it is thus possible to make a fine adjustment to these stiffnesses, by varying the dimensions of the membrane and/or the dimensions of the blades. Increasing the thickness of the membrane and/or the width of the blades increases the stiffness of the hinges, and displacement of the mass along the Z direction can also be controlled.

The hinge has the advantage of providing very good guidance along Z, while remaining relatively compact due to its low thickness.

It will be understood that the hinges can be configured to enable a required displacement along the X direction. In this case, the blades can be elongated along the direction of the beam and/or made thinner, providing some flexibility along the X direction.

Figure 6:
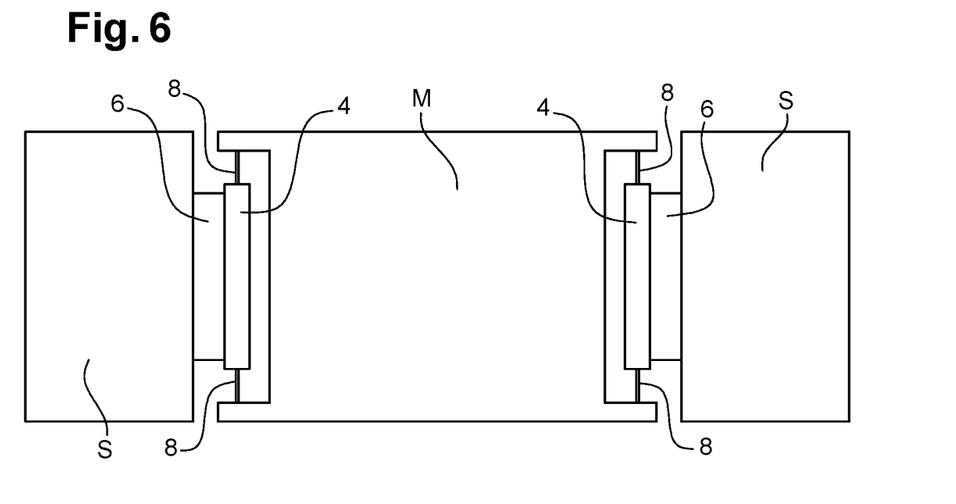
FIG. 6 is a top view of another example of an M&NEMS system comprising hinges according to the invention.

FIG. 6 shows another example of a MEMS system comprising two hinges arranged symmetrically relative to the moving part M and in which the blades 8 are anchored on the moving part M and the membranes are anchored on the fixed part S.

Operation is similar to operation of the system in FIG. 5. Very good retention is obtained in the Y direction with guidance along the Z direction with a low degree of non-linearity.

Figure 7:
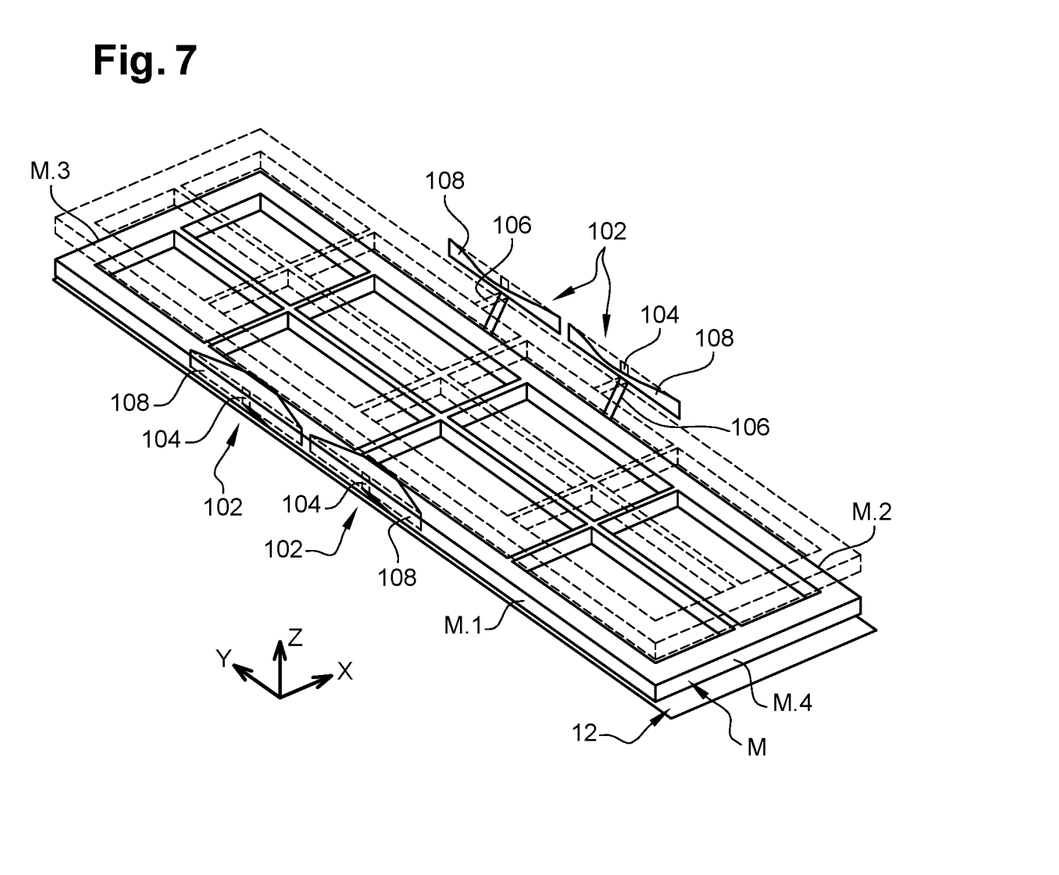
FIG. 7 is a top view of another example of a system comprising hinges according to the invention in a rest state and in an out-of-plane displacement state.

FIG. 7 shows another example of a MEMS system comprising four hinges. Two hinges 102 are anchored to a first edge M.1 of the moving mass and two hinges 102 are anchored to a second edge M.2 of the moving mass M parallel to the first edge.

In this example, the length Lb of the first part 104 is small compared with the length Lm of the blades 108. Furthermore, the width Lm of the membranes 104 is large compared with their length Lm.

For example, the hinges of the system in FIG. 7 may have the following dimensions:

Tm=1 µm; Lm=10 µm; Wm=35 µm
Tb=20 µm; Lb=10 µm; Wb=4 µm
Tl=18 µm; Ll=84 µm; Wl=1 µm

The stiffness of a set of four hinges is 80 N/m

FIG. 7 shows the moving part M in the rest state, and in an out-of-plane position during displacement. In the example shown, the displacement in the Z direction is of the order of 40 nm. Such a structure enables a displacement between about 100 nm and about 1 µm.

It will be understood that more than two hinges side by side can be used.

Furthermore, different numbers of hinges can be used anchored to the edges of the moving part.

For example, the system in FIG. 7 can be intended to use a hinge on edge M.3 of the moving part and a hinge on the edge M.4 of the moving part.

The hinges in FIGS. 5 and 6 can be combined, for example the structure comprises a moving part suspended by two hinges according to the invention, one is fixed to the moving part by its second part (FIG. 5) and the other is fixed to its moving part by its third parts.

The hinge according to the invention can be used in MEMS sensors, and means of detecting movement of the mass along Z are provided for this purpose, for example capacitive means or piezoresistive or piezoelectric strain gauges.

The hinge according to the invention can be used in MEMS actuators and means 12 of actuating the moving part along the Z direction are provided for this purpose, for example electrostatic means shown diagrammatically on FIG. 7. The electrostatic means comprise at least one pair of electrodes, one being formed on the substrate under the moving part M and the other electrode being formed on the moving part M facing the electrode on the substrate S. Application of a potential difference generates electrostatic forces between the two electrodes and therefore an out-of-plane displacement of the moving mass M relative to the substrate S.

Very advantageously, a MEMS system comprising hinges according to the invention can be used to make a microphone. On FIG. 7, the moving part M can form a piston that can displace in Z under the effect of a differential pressure between its two faces, due to a sound wave.

The hinge and the MEMS system can advantageously be fabricated by known microelectronics processes by deposition of layers and etching. For example, examples of fabrication processes described in document FR2941533 can be used to make such a MEMS system.

For example, the membranes are formed by the upper layer of an SOI (Silicon on Insulator) substrate and the first part and the blades are made by etching and release. As a variant, the membranes are made by deposition of a layer with a thickness of several hundred nm and the first part and the blades are made by etching and release.

Very advantageously, at least the first part and the third parts are made in the same layer as the layer in which the moving part and a part of the fixed part are made.

For example, the system is made from a semiconducting material such as silicon or SiGe.

The invention claimed is:

1. A hinge between a first element and a second element of a microelectromechanical system, the first element and the second element movable relative to each other at least in an out-of-plane direction, said hinge comprising:
    a first rigid part,
    a second part fixed to the first rigid part at one end and configured to be anchored on the first element, said second part being configured to deform in bending in a first direction, and
    two third parts fixed to the first rigid part and configured to be anchored to the second element, the two third parts being configured to deform in bending along a second direction orthogonal to the first direction.

2. The hinge according to claim 1, wherein, in an undeformed state, the two third parts extend in a plane orthogonal to a plane in which the second part extends.

3. The hinge according to claim 1, wherein a dimension of the second part in the first direction is less than dimensions of the second part in directions other than the first direction.

4. The hinge according to claim 1, wherein the first part extends in the first direction between a first plane and a second plan, and
    the second part comprises a face located in the first plane or the second plane.

5. The hinge according to claim 1, wherein the two third parts comprise at least two blades extending over at least part of a dimension of the first part in the first direction.

6. The hinge according to claim 5, wherein each of the two third parts comprises a blade, the two blades being coplanar and arranged so as to also deform in torsion.

7. The hinge according to claim 5, wherein each of the two third parts comprises two blades, one blade of each third part being coplanar with a blade of the other third part, and
    the two blades of one of the third parts are arranged relative to each other so as to not substantially deform in torsion.

8. The hinge according to claim 1, wherein the second part comprises a lattice structure to provide flexibility in the first direction and stiffness in a third direction orthogonal to the first and second directions.

9. The hinge according to claim 8, wherein a thickness of the second part in the first direction is between about a hundred nm and several microns, a length of the second part in a third direction and a width of the second part in the second direction are between several μm and several hundred μm.

10. The hinge according to claim 8, wherein a thickness of each of the two third parts in the first direction is between about 10 μm and several tens of μm, a length of each of the two third parts in the second direction is between 100 nm and several micrometres, and a length of each of the two third parts in a third direction is between several μm and several tens of μm.

11. The hinge according to claim 8, wherein a thickness of the first rigid part in the first direction, a length of the first rigid part in the third direction, and a width of the first rigid part in the second direction are between several μm and several hundred μm.

12. The microelectromechanical system, comprising:
    the first element and the second element moveable relative to each other in at least the out-of-plane direction; and
    two of the hinges according to claim 8, each hinge anchored to the first element and to the second element,
    wherein the two of the hinges are oriented such that the first direction is the out-of-plane direction and the second direction and the third direction are in-plane directions.

13. The microelectromechanical system according to claim 12, wherein the two of the hinges are arranged symmetrically about a plane of symmetry of the first element, the plane containing the out-of-plane direction.

14. The microelectromechanical system according to claim 13, wherein the first part extends in the first direction between a first plane and a second plane,
    the second part comprises a face located in the first plane or the second plane, and
    the second plane is on a side of the first part and the second part comprises a face extending in the second plane.

15. The microelectromechanical system according to claim 12, further comprising at least four of the hinges such that torsion axes of the two third parts of each of the at least four hinges are arranged orthogonal to each other.

16. The microelectromechanical system according to claim 12, further comprising at least one actuator configured to move the second element at least in an out-of-plane direction.

17. A microphone, comprising:
    the first element and the second element movable relative to each other in at least the out-of-plane direction; and
    two of the hinges according to claim 8, each anchored to the first element and to the second element,
    wherein the at least two of the hinges are oriented such that the first direction is the out-of-plane direction and the second direction and the third direction are in-plane directions.

18. The hinge of claim 1, wherein the first rigid part is movable with respect to the first element.

* * * * *